(12) United States Patent
Akutsu

(10) Patent No.: US 11,248,148 B2
(45) Date of Patent: Feb. 15, 2022

(54) METHOD FOR MANUFACTURING ELECTRICALLY CONDUCTIVE ADHESIVE FILM, ELECTRICALLY CONDUCTIVE ADHESIVE FILM, AND METHOD FOR MANUFACTURING CONNECTOR

(71) Applicant: DEXERIALS CORPORATION, Tokyo (JP)

(72) Inventor: Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 750 days.

(21) Appl. No.: 14/904,495

(22) PCT Filed: Jul. 28, 2014

(86) PCT No.: PCT/JP2014/069795
§ 371 (c)(1),
(2) Date: Jan. 12, 2016

(87) PCT Pub. No.: WO2015/016169
PCT Pub. Date: Feb. 5, 2015

(65) Prior Publication Data
US 2016/0280969 A1    Sep. 29, 2016

(30) Foreign Application Priority Data
Jul. 29, 2013  (JP) .............................. JP2013-157100

(51) Int. Cl.
*C09J 9/02* (2006.01)
*C09J 11/04* (2006.01)
(Continued)

(52) U.S. Cl.
CPC . *C09J 9/02* (2013.01); *C09J 7/22* (2018.01); *C09J 7/30* (2018.01); *C09J 11/04* (2013.01);
(Continued)

(58) Field of Classification Search
CPC .... C09J 9/02; C09J 2205/102; C09J 2205/11; H05K 3/323; H05K 3/321; H01R 43/16
See application file for complete search history.

(56) References Cited

U.S. PATENT DOCUMENTS 6,077,382 A * 6/2000 Watanabe .................. C09J 5/06
156/299
2001/0008169 A1  7/2001 Connell et al.
(Continued)

FOREIGN PATENT DOCUMENTS

JP       H0575249 A  *  3/1993   ............ H05K 3/321
JP       09097814 A  *  4/1997   ............ H01L 24/05
(Continued)

OTHER PUBLICATIONS

Machine translation of JP 2008-186761A (Year: 2008).*
Oct. 14, 2014 International Search Report issued in International Patent Application No. PCT/JP2014/069795.

*Primary Examiner* — Scott R. Walshon
(74) *Attorney, Agent, or Firm* — Oliff PLC

(57) ABSTRACT

Methods for securely transferring and attaching electrically conductive particles filled in openings to a binder resin layer. The methods include a step of filling a solvent and electrically conductive particles in a plurality of openings formed on a surface of a substrate in a predetermined pattern, a step of pasting a surface on which a binder resin layer is formed of an adhesive film having the binder resin layer formed on a base film on a surface on which the openings are formed of the substrate, and a step of peeling off the adhesive film from the surface of the substrate and transferring and attaching the electrically conductive particles filled in the openings to the binder resin layer while heating the substrate.

16 Claims, 4 Drawing Sheets

(51) Int. Cl.
- *H05K 3/32* (2006.01)
- *C09J 7/22* (2018.01)
- *C09J 7/30* (2018.01)
- *H01R 43/16* (2006.01)
- *C08K 7/18* (2006.01)
- *C08K 3/04* (2006.01)
- *C08K 3/08* (2006.01)
- *H05K 3/36* (2006.01)

(52) U.S. Cl.
CPC ............ *H01R 43/16* (2013.01); *H05K 3/323* (2013.01); *C08K 3/04* (2013.01); *C08K 3/08* (2013.01); *C08K 7/18* (2013.01); *C09J 2203/326* (2013.01); *C09J 2301/314* (2020.08); *C09J 2301/408* (2020.08); *C09J 2433/00* (2013.01); *C09J 2463/00* (2013.01); *C09J 2467/006* (2013.01); *H05K 3/361* (2013.01); *H05K 2201/0224* (2013.01); *H05K 2203/0139* (2013.01); *H05K 2203/0534* (2013.01); *H05K 2203/0545* (2013.01)

(56) References Cited

U.S. PATENT DOCUMENTS

| | | | |
|---|---|---|---|
| 2006/0280912 A1 | 12/2006 | Liang et al. | |
| 2009/0239082 A1* | 9/2009 | Fujita | H05K 3/323 428/413 |
| 2010/0051878 A1* | 3/2010 | Akutsu | C09J 9/02 252/500 |
| 2010/0230141 A1* | 9/2010 | Yamamoto | H05K 3/323 174/255 |
| 2010/0233926 A1* | 9/2010 | Shin | C09J 9/00 442/149 |
| 2010/0317759 A1* | 12/2010 | Ryu | C09J 9/02 521/149 |
| 2011/0223379 A1* | 9/2011 | Ogawa | C09J 11/04 428/131 |
| 2012/0148791 A1* | 6/2012 | Yamanaka | C09J 7/385 428/114 |
| 2013/0118773 A1* | 5/2013 | Liu | C09J 9/02 174/117 F |
| 2013/0244020 A1* | 9/2013 | Terada | C09J 133/08 428/317.3 |

FOREIGN PATENT DOCUMENTS

| | | | | |
|---|---|---|---|---|
| JP | 2002-519473 A | 7/2002 | | |
| JP | 2004-335663 A | 11/2004 | | |
| JP | 2005-209454 A | 8/2005 | | |
| JP | 2008-186761 A | 8/2008 | | |
| JP | 2009-535843 A | 10/2009 | | |
| WO | WO-2007083937 A2 * | 7/2007 | ............ | H04R 5/027 |
| WO | WO-2012063935 A1 * | 5/2012 | ............ | C09J 133/08 |
| WO | 2014/021424 A1 | 2/2014 | | |
| WO | 2014/030753 A1 | 2/2014 | | |

* cited by examiner

METHOD FOR MANUFACTURING ELECTRICALLY CONDUCTIVE ADHESIVE FILM, ELECTRICALLY CONDUCTIVE ADHESIVE FILM, AND METHOD FOR MANUFACTURING CONNECTOR

TECHNICAL FIELD

The present invention relates to an electrically conductive adhesive, particularly relates to a method for manufacturing an electrically conductive adhesive film that is suitably usable in anisotropic conductive connection, an electrically conductive adhesive film manufactured by using this manufacturing method, and a method for manufacturing a connector using this electrically conductive adhesive film.

This application is based upon and claims the benefit of priority of the prior Japanese Patent Application No. 2013-157100 filed in the Japan Patent Office on Jul. 29, 2013, the entire contents of which are incorporated herein by reference.

BACKGROUND ART

Hitherto, an anisotropic conductive film obtained by molding a binder resin in which electrically conductive particles are dispersed as an adhesive into a film is used when connecting a rigid substrate such as a glass substrate or a glass epoxy substrate to a flexible substrate or an IC chip or when connecting flexible substrates to each other. When the case of connecting the connecting terminal of a flexible substrate to the connecting terminal of a rigid substrate is described as an example, as illustrated in FIG. 5(A), an anisotropic conductive film 53 is disposed between the regions in which both connecting terminals 52 and 55 of a flexible substrate 51 and a rigid substrate 54 are formed, a buffer material 50 is appropriately disposed on the flexible substrate 51, and the substrates 51 and 54 are heat-pressurized from the top of the flexible substrate 51 by a heating and pressing head 56. By virtue of this, as illustrated in FIG. 5(B), the binder resin becomes fluid to flow out from between the connecting terminal 52 of the flexible substrate 51 and the connecting terminal 55 of the rigid substrate 54 and also the electrically conductive particles in the anisotropic conductive film 53 are pressed and deformed by being sandwiched between the two connecting terminals.

As a result, the connecting terminal 52 of the flexible substrate 51 and the connecting terminal 55 of the rigid substrate 54 are electrically connected to each other via the electrically conductive particles, and the binder resin is cured in this state. The electrically conductive particles that are not present between the two connecting terminals 52 and 55 are dispersed in the binder resin and maintained in the electrically isolated state. By virtue of this, it is possible to achieve electrical conduction only between the connecting terminal 52 of the flexible substrate 51 and the connecting terminal 55 of the rigid substrate 54.

CITATION LIST

Patent Literature

Patent Literature 1: JP 2009-535843 W

SUMMARY OF INVENTION

Technical Problem

In recent years, high density mounting of electronic components has advanced in association with the miniaturization and thinning mainly of small-sized portable electronic devices such as a mobile phone or a smart phone, a tablet PC, and a notebook computer, and the microminiaturization of the connecting terminals and the narrowing of the interval between the adjacent connecting terminals have advanced in a so-called FOB (Film on Board) connection to connect a flexible substrate to a main substrate or a so-called FOF (Film on Film) connection to connect flexible substrates to each other. In addition, the microminiaturization of the connecting terminals due to an increase in terminals associated with high definition of the screen and miniaturization of the control IC and the narrowing of the interval between the adjacent connecting terminals have advanced in a so-called COG (Chip on Glass) connection to connect the control IC of a liquid crystal screen to the ITO wiring of a glass substrate.

As such microminiaturization of the connecting terminals associated with the requirement of high density mounting and the narrowing of the interval between connecting terminals advance, it is concerned that the electrically conductive particles are linked to one another between the micro terminals to cause a short circuit between the terminals since the electrically conductive particles are randomly dispersed in the binder resin in the anisotropic conductive film of prior art.

In order to cope with such a problem, a decrease in particle size of the electrically conductive particles and a method to form an insulating film on the particle surface have been proposed, but it is concerned that the particle capture rate on the microminiaturized connecting terminal decreases when the particle size of the electrically conductive particles decreases, and it is not possible to completely prevent the short circuit between the terminals in the case of forming the insulating film.

Hence, in order to cope with such a problem, a method is considered in which an increase in particle capture rate on the microminiaturized connecting terminal and prevention of a short circuit between adjacent connecting terminals having a narrowed interval are achieved by aligning the electrically conductive particles at equal intervals in advance. As the method for aligning the electrically conductive particles at equal intervals, for example, a method has been proposed in which electrically conductive particles are filled in a myriad of openings (microcavities) formed on a substrate in a predetermined pattern and transferred and attached onto the binder resin layer so as to arrange the electrically conductive particles filled in the openings on the binder resin layer in an array pattern of the openings (Patent Literature 1).

However, in the method described in Patent Literature 1, the electrically conductive particles are not transferred and attached to the binder resin layer but remain in the microcavities in some cases. Because of this, a deficient region in which the electrically conductive particles are not arranged is generated on the binder resin layer, thus the particle capture rate decreases when the deficient region is pasted onto the connecting terminal, and an increase in conduction resistance is caused.

In addition, when the pressure for laminating the binder resin layer is increased at the time of pasting the binder resin layer onto the substrate on which the microcavities are formed in order to take out more electrically conductive particles from the microcavities, the binder resin enters the microcavities so that the adhesive force therebetween increases, thus it is not possible to cleanly peel off the binder resin layer at the time of peeling off since a so-called anchoring effect is generated, and also the electrically conductive particles remain in the microcavities together with the binder resin.

Accordingly, an object of the invention is to provide a method for manufacturing an electrically conductive adhesive film which can securely transfer and attach electrically conductive particles filled in microcavities to a binder resin layer and arrange them in a predetermined pattern, an electrically conductive adhesive film formed using the method, and a method for manufacturing a connector.

Solution to Problem

In order to solve the above problem, a method for manufacturing an electrically conductive adhesive film according to the invention is a method which includes a step of filling a solvent and electrically conductive particles in a plurality of openings formed on a surface of a substrate in a predetermined pattern corresponding to an array pattern the electrically conductive particles, a step of pasting a surface on which a binder resin layer is formed of an adhesive film having the binder resin layer formed on a base film on a surface on which the openings are formed of the substrate, and a step of peeling off the adhesive film from the surface of the substrate and transferring and attaching the electrically conductive particles filled in the openings to the binder resin layer while heating the substrate.

In addition, an electrically conductive adhesive film according to the invention is one that is manufactured by the manufacturing method described above.

In addition, a method for manufacturing a connector according to the invention is a method for manufacturing a connector obtained by connecting a plurality of terminals arranged in parallel to one another by an anisotropic conductive film having electrically conductive particles arranged therein, in which the anisotropic conductive film is manufactured by a step of filling a solvent and electrically conductive particles in a plurality of openings formed on a surface of a substrate in a predetermined pattern, a step of pasting a surface on which a binder resin layer is formed of an adhesive film having the binder resin layer formed on a base film on a surface on which the openings are formed of the substrate, and a step of peeling off the adhesive film from the surface of the substrate and transferring and attaching the electrically conductive particles filled in the openings to the binder resin layer while heating the substrate.

Advantageous Effects of Invention

According to the invention, it is possible to securely take out electrically conductive particles from openings and to transfer and attach the electrically conductive particles to a binder resin layer as the volume of the solvent expands by heating, and it is possible to smoothly peel off the binder resin layer and to arrange the electrically conductive particles on the binder resin layer in a predetermined pattern corresponding to the pattern of the openings as the anchoring effect of the binder resin layer is prevented. Accordingly, this makes it possible to provide an electrically conductive adhesive film which can capture the electrically conductive particles in the microminiaturized connecting terminal as well as prevent a short circuit between terminals even though microminiaturization of the connecting terminal and the narrowing of the interval between connecting terminals advance and thus can meet the requirement of high density mounting.

BRIEF DESCRIPTION OF DRAWINGS

FIGS. 5(A) and 5(B) are cross-sectional views illustrating the manufacturing process of a connector using an anisotropic conductive film of prior art, in which FIG. 5(A) illustrates the state before pressure joining, and FIG. 5(B) illustrates the state after pressure joining.

DESCRIPTION OF EMBODIMENTS

Hereinafter, the method for manufacturing an electrically conductive adhesive film, an electrically conductive adhesive film, and a method for manufacturing a connector to which the invention is applied will be described in detail with reference to the accompanying drawings. Incidentally, the invention is not intended to be limited only to the following embodiments, but it should be understood that the various changes, substitutions, and alterations could be made hereto without departing from the spirit and scope of the invention. In addition, the drawings are schematic, and the ratio and the like of the respective dimensions may be different from the reality. The specific dimensions and the like should be judged in consideration of the following description. Moreover, it should be understood that the drawings include portions in which the relationships and ratios of the dimensions are different from one another.

[Anisotropic Conductive Film]

The electrically conductive adhesive film to which the invention is applied is suitably used as an anisotropic conductive film 1 for achieving conduction between connecting terminals as electrically conductive particles are equally dispersed and disposed on a binder resin to be an adhesive in a predetermined pattern and the electrically conductive particles are sandwiched between the connecting terminals facing each other. In addition, as the connector using an electrically conductive adhesive film to which the invention is applied is, for example, a connector in which an IC or a flexible substrate is COG, FOB, or FOF connected using the anisotropic conductive film 1 and another connector, and the connector can be suitably used in any devices such as television, or PC, mobile phones, game machines, audio devices, and tablet terminators, or vehicle-mounted monitors.

The anisotropic conductive film 1 is a thermosetting adhesive or a photocurable adhesive such as an ultraviolet curable adhesive, is fluidized by being heated and pressurized by a pressure tool (not illustrated) so that the electrically conductive particles are pressed and deformed between the connecting terminals facing to each other, and is cured by being heated or irradiated with ultraviolet rays in a state in which the electrically conductive particles are pressed and deformed. By virtue of this, the anisotropic conductive film 1 electrically and mechanically connects an IC or a flexible substrate to a connecting target such as a glass substrate.

Figure 1:
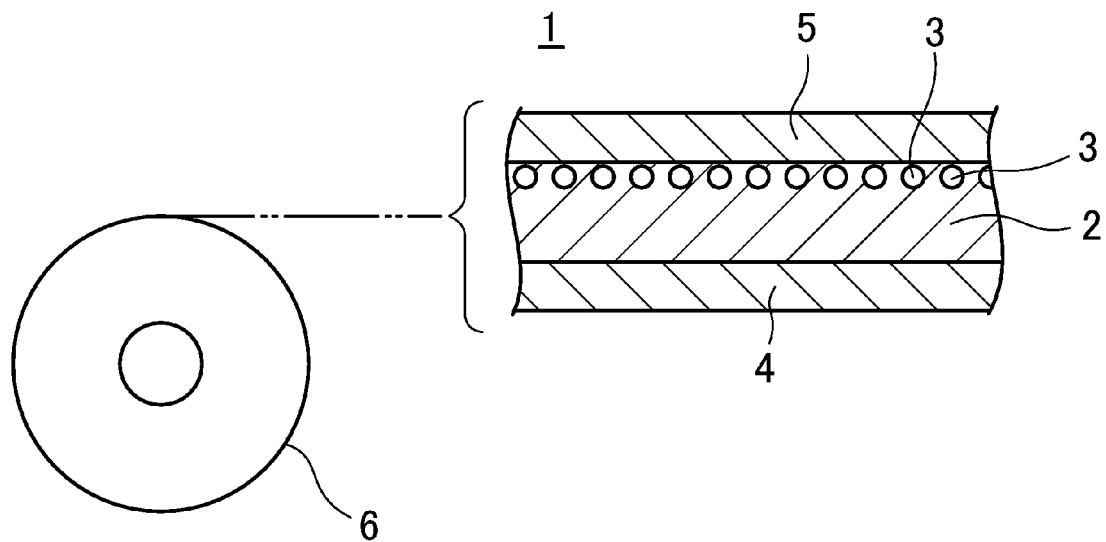
FIG. 1 is a cross-sectional view illustrating an anisotropic conductive film to which the invention is applied.

The anisotropic conductive film 1 is one, for example, as illustrated in FIG. 1, in which electrically conductive particles 3 are disposed on an ordinary binder resin 2 (adhesive) containing a film-forming resin, a thermosetting resin, a latent curing agent, a silane coupling agent, and the like in a predetermined pattern and this thermosetting adhesive composition is supported by first and second base films 4 and 5 of an upper and lower pair.

The first and second base films 4 and 5 are formed, for example, by coating a release agent such as silicone on PET (Poly Ethylene Terephthalate), OPP (Oriented Polypropylene), PMP (Poly-4-methylpentene-1), PTFE (Polytetrafluoroethylene), and the like.

As the film forming resin contained in the binder resin 2, a resin having an average molecular weight of about from 10000 to 80000 is preferable. Examples of the film forming resin may include various kinds of resins such as an epoxy resin, a modified epoxy resin, a urethane resin, and a phenoxy resin. Among them, a phenoxy resin is even more preferable from the viewpoint of the film formed state, connection reliability, and the like.

The thermosetting resin is not particularly limited, and examples thereof may include an epoxy resin and an acrylic resin that are commercially available.

The epoxy resin is not particularly limited, and examples thereof may include a naphthalene type epoxy resin, a biphenyl type epoxy resin, a phenol novolak type epoxy resin, a bisphenol type epoxy resin, a stilbene type epoxy resin, a triphenol methane type epoxy resin, a phenol aralkyl type epoxy resin, a naphthol type epoxy resin, a dicyclopentadiene type epoxy resin, and a triphenylmethane type epoxy resin. These may be a single substance or a combination of two or more kinds thereof.

The acrylic resin is not particularly limited, and an acrylic compound, a liquid acrylate, and the like can be appropriately selected depending on the purpose. Examples thereof may include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, urethane acrylate, and epoxy acrylate. In addition, it is also possible to use those in which acrylate is converted to methacrylate. These may be used singly or two or more kinds thereof may be used concurrently.

The latent curing agent is not particularly limited, and examples thereof may include various kinds of curing agents of a heat curing type, a UV curing type, and the like. The latent curing agent does not react under a normal condition, but it is activated by various kinds of triggers which are selected depending on the application, such as heat, light, and pressurization and starts to react. As the method for activating a thermally activated latent curing agent, there are a method in which active species (a cation or an anion, and a radical) are produced through the dissociation reaction caused by heating, and the like, a method in which the latent curing agent is stably dispersed in an epoxy resin at around room temperature, but at a higher temperature, it is compatible with and dissolves in the epoxy resin to start the curing reaction, a method in which a molecular sieve encapsulation type curing agent is eluted at a high temperature to start the curing reaction, a method of elution and curing by a microcapsule, and the like. Examples of the thermally activated latent curing agent may include imidazole-based one, hydrazide-based one, a boron trifluoride-amine complex, a sulfonium salt, an amine imide, a polyamine salt, dicyandiamide, and any modified product thereof, and these may be a single substance or a mixture of two or more kinds thereof. Among them, the microcapsule type imidazole-based latent curing agent is preferable.

The silane coupling agent is not particularly limited, and examples thereof may include epoxy-based one, amino-based one, mercapto and sulfide-based one, and ureido-based one. The adhesive property at the interface between an organic material and an inorganic material is improved by adding a silane coupling agent.

[Electrically Conductive Particles]

Examples of the electrically conductive particles 3 may include any known electrically conductive particles which are used in the anisotropic conductive film 1. Examples of the electrically conductive particles 3 may include particles of various kinds of metals such as nickel, iron, copper, aluminum, tin, lead, chromium, cobalt, silver, and gold, or particles of a metal alloy, a metal oxide, those obtained by coating a metal on the surface of particles of carbon, graphite, glass, a ceramic, a plastic, or the like, or those obtained by further coating an insulating film on the surface of these particles. In the case of those obtained by coating a metal on the surface of resin particles, examples of the resin particles may include particles of an epoxy resin, a phenolic resin, an acrylic resin, an acrylonitrile-styrene (AS) resin, a benzoguanamine resin, a divinylbenzene-based resin, and a styrene-based resin.

In the anisotropic conductive film 1, as to be described later, the electrically conductive particles 3 are regularly arranged in a predetermined array pattern and thus the occurrence of coarseness and fineness due to aggregation of the electrically conductive particles is prevented. Hence, according to the anisotropic conductive film 1, it is possible to prevent a short circuit between terminals by aggregates of the electrically conductive particles even though the narrowing of the interval between connecting terminals advances, it is also possible to capture the electrically conductive particles even in a microminiaturized connecting terminal and thus to meet the requirement of high density mounting.

Incidentally, the shape of the anisotropic conductive film 1 is not particularly limited, and for example, it may have a long tape shape capable of being wound around a take-up reel 6 as illustrated in FIG. 1 so that it may be cut by a predetermined length for use.

In addition, in the embodiment described above, the anisotropic conductive film 1 has been described by taking an adhesive film obtained by molding a thermosetting resin composition containing the electrically conductive particles 3 in the binder resin 2 in a film shape as an example, but the adhesive according to the invention is not limited thereto, and for example, it may have a configuration in which an insulating adhesive layer composed of only the binder resin 2 and an electrically conductive particle-containing layer composed of the binder resin 2 containing the electrically conductive particles 3 are laminated.

[Manufacturing Process of Anisotropic Conductive Film]

Figure 2:
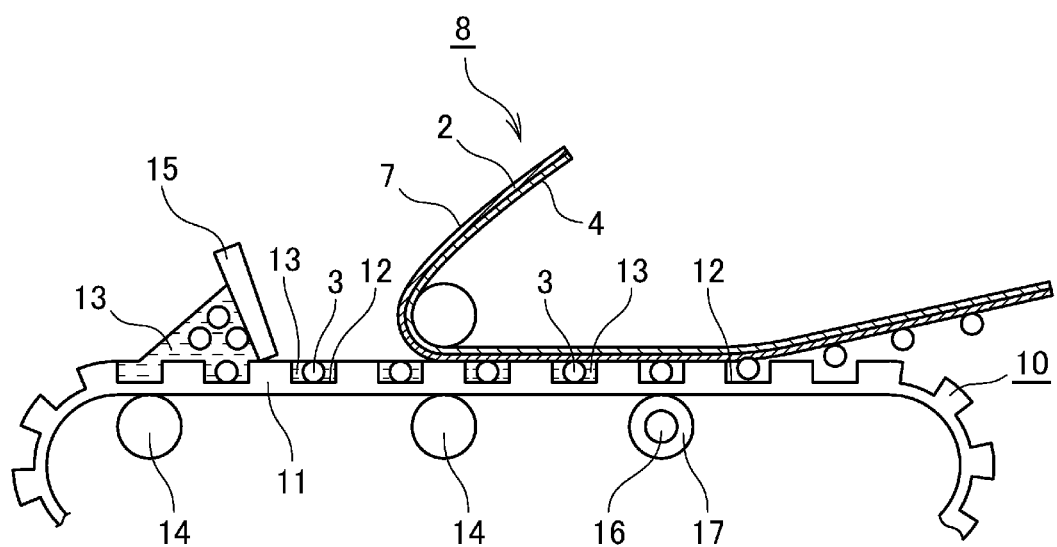
FIG. 2 is a cross-sectional view illustrating the manufacturing process of an anisotropic conductive film to which the invention is applied.

Subsequently, the manufacturing process of the anisotropic conductive film 1 will be described. As illustrated in FIG. 2, in the manufacturing process of the anisotropic conductive film 1, first, the electrically conductive particles 3 are arranged in the pattern of openings 12 as the electrically conductive particles 3 are filled in the openings 12 together with a solvent 13 using an array plate 10 in which the openings (microcavities) 12 are formed on the surface of a substrate 11. Subsequently, the surface on which an adhesive layer 7 is formed of an insulating adhesive film 8 in which adhesive layer 7 composed of the binder resin 2 is formed on the first base film 4 is pasted onto the surface on which the openings 12 are formed of the substrate 11. Thereafter, the insulating adhesive film 8 is peeled off from the surface of the substrate 11 and the electrically conductive particles 3 filled in the openings 12 are transferred and attached to the adhesive layer 7 while heating the substrate 11.

[Array Plate 10]

The array plate 10 is one that aligns the electrically conductive particles 3 in advance in a pattern in which the electrically conductive particles 3 are arranged on the binder resin 2 of the anisotropic conductive film 1, and a plurality of openings 12 formed on the surface of the substrate 11 in a predetermined pattern corresponding to the array pattern of the electrically conductive particles 3 are formed on the array plate 10.

The substrate 11 can be formed using, for example, a polyester such as polyethylene terephthalate or polyethylene naphthalate, a polycarbonate, a polyamide, a polyacrylate, a polysulfone, a polyether, a polyimide, a polyamide, a liquid crystalline polymer, and any mixture, any composite, or any laminate thereof, or a non-ferrous metal such as steel including SUS or aluminum.

Incidentally, the surface on which the openings 12 are formed of the substrate 11 may be subjected to a release treatment in order to enhance the peeling performance of the binder resin 2. The release layer may be applied before or after the formation of the openings 12 by coating, printing, spraying, vapor deposition, thermal transfer, plasma polymerization, or crosslinking. Examples of suitable material for the release layer may include a fluoropolymer or an oligomer, silicone oil, a fluorosilicone, a polyolefin, wax, poly(ethylene oxide), poly(propylene oxide), a surfactant having a hydrophobic block or a branched long-chain, or any copolymer or any mixture thereof, but it is not necessarily limited to these.

The openings 12 are formed on the surface of the substrate 11 in the same pattern as the array pattern of the electrically conductive particles 3 arranged on the binder resin 2 of the anisotropic conductive film 1, and for example, they are equally arranged in a lattice shape. The openings 12 can be formed, for example, by laser ablation, embossing, stamping, or a lithographic process using a photoresist, another etching process, electroforming, or the like.

In addition, the opening 12 has an opening size and a depth which correspond to the average particle size of the electrically conductive particles 3 to be used. The opening size of the opening 12 is formed in a size so that only one electrically conductive particle 3 enters one opening 12, namely, a size that is greater than the average particle size of the electrically conductive particles 3 and less than 2 times the average particle size of the electrically conductive particles 3. In addition, the depth of the opening 12 is formed in a depth so that the binder resin 2 can closely adhere to the electrically conductive particle 3 when the insulating adhesive film 8 to be described later is pasted as well as the electrically conductive particles 3 filled is held, and for example, the opening 12 is formed in a depth deeper than the radius of the electrically conductive particles 3 and preferably approximately the same depth as the average particle size of the electrically conductive particles 3.

Incidentally, the opening 12 may be formed so as to have a wider opening size at the top than the bottom in order to facilitate the filling, transfer, and attachment of the electrically conductive particles 3.

[Solvent]

In the openings 12, the electrically conductive particles 3 are filled together with the solvent 13. The solvent 13 is one that is vaporized by being heated in the peeling step of the insulating adhesive film 8 so as to promote the peeling of the binder resin 2 from the substrates 11 as well as to facilitate the transfer and attachment of the electrically conductive particles 3 from the openings 12 to the binder resin 2 by the volume expansion.

The solvent 13 may be liquid or solid. As the liquid solvent 13, it is possible to use an arbitrary solvent such as water or ethanol. As the solid solvent, it is possible to use, for example, dry ice.

As the solvent 13, a liquid is preferable since it is easily filled in the opening 12 together with the conductive particles 3. In addition, it is possible to spray the solvent to the array plate 10 together with the electrically conductive particles 3 and to fill the solvent in the opening 12 as a liquid solvent is used. Incidentally, in the case of using the solid solvent 13, it is possible to fill the solvent in the opening 12 as the electrically conductive particles 3 covered with, for example, dry ice in advance are used.

In addition, as the solvent 13, those in which the binder resin 2 has a low solubility (for example, 5% or less) are preferably used. This is because it is difficult to transfer and attach the electrically conductive particles 3 to the binder resin 2 when the binder resin 2 in contact with the solvent 13 dissolves and also it is not possible to maintain the film shape when the dissolution proceeds.

[Insulating Adhesive Film]

The insulating adhesive film 8 that is pasted to the array plate 10 and transfers and attaches the electrically conductive particles 3 in the openings 12 is one in which the adhesive layer 7 composed of the binder resin 2 is formed on the first base film 4 constituting the anisotropic conductive film 1. The second base film 5 is bonded to the insulating adhesive film 8 after the electrically conductive particles 3 are transferred and attached to the adhesive layer 7.

[Steps of Filling and Pasting]

In the step of filling the electrically conductive particles 3 in the openings 12 of the array plate 10, the electrically conductive particles 3 dispersed in the liquid solvent 13 are scattered on the array plate 10 as well as the array plate 10 is conveyed on a plurality of conveying rollers 14, and one of the electrically conductive particles 3 is filled in one of the openings 12 together with the liquid solvent 13 using a squeegee 15. The step of filling the electrically conductive particles 3 is repeated until the fact that there is no lack of the electrically conductive particles 3 in the openings 12 is confirmed. The excess electrically conductive particles 3 may be removed by, for example, a wiper, a doctor blade, or an air knife. By virtue of this, the electrically conductive particles 3 are arranged in the pattern of the openings 12.

Subsequently, the surface on which the adhesive layer 7 is formed of the insulating adhesive film 8 is pasted on the surface on which the openings 12 are formed of the substrate 11. The insulating adhesive film 8 is pasted by roll lamination, or the like.

[Step of Peeling, Transferring, and Attaching]

Subsequently, the insulating adhesive film 8 is peeled off from the surface of the substrate 11 and the electrically conductive particles 3 filled in the openings 12 are transferred and attached to the adhesive layer 7 while heating the substrate 11. As the substrate 11 is heated, the solvent 13 filled in the openings 12 together with the electrically conductive particles 3 is vaporized, and it is possible to suppress the anchoring effect by the openings 12 and to promote the peeling of the binder resin 2 from the substrates 11 as well as to facilitate the transfer and attachment of the electrically conductive particles 3 from the openings 12 to the binder resin 2 by the volume expansion.

Incidentally, the solvent 13 is intended to exert volume expansion by vaporization, and the volume expansion may be caused by any state change of evaporation, boiling, or sublimation. Among them, it is preferable to heat the liquid solvent 13 to a temperature higher than the boiling temperature thereof in order to allow the liquid solvent 13 to instantaneously and sufficiently exert volume expansion so that the electrically conductive particles 3 are securely transferred and attached and also to shorten the heating time of the binder resin 2.

The means for heating the substrate 11 is not limited. For example, as illustrated in FIG. 2, a heating roller 17 having a built-in heater 16 is disposed in the peeling location of the insulating adhesive film 8 and the substrate 11 may be heated while being conveyed.

In addition, the heating temperature of the substrate 11 is preferably a temperature lower than the temperature at which the binder resin 2 has the minimum melt viscosity. This is because the fluidity of the binder resin 2 increases, thus the film shape cannot be maintained, and the electrically conductive particles 3 cannot be transferred and attached when the binder resin 2 is heated to this temperature or higher.

Figure 3A:
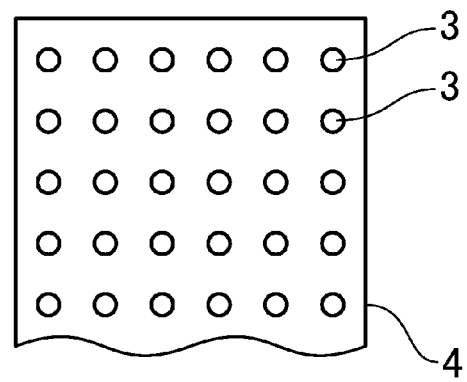
FIGS. 3(A) to 3(C) are cross-sectional views illustrating a step of laminating a second base film after the electrically conductive particles are transferred and attached.
Figure 3A:

The electrically conductive particles 3 are equally transferred onto the surface of the adhesive layer 7 of the insulating adhesive film 8 peeled off from the wiring plate 10 in a lattice shape in accordance with the pattern of the openings 12 (FIG. 3(A)).

Incidentally, after the electrically conductive particles 3 are discharged from the openings 12, the array plate 10 is appropriately subjected to the cleaning and the release treatment and then utilized again for the filling and arrangement of the electrically conductive particles 3. In addition, as the array plate 10 is annularly formed as well as flexible and is circulated by the conveying roller, it is possible to continuously conduct filling of the electrically conductive particles 3, pasting of the insulating adhesive film 8, transfer and attachment of the electrically conductive particles 3, and peeling of the insulating adhesive film 8, and thus it is possible to improve the manufacturing efficiency.

[Step of Pasting Second Base Film]

Figure 3B:
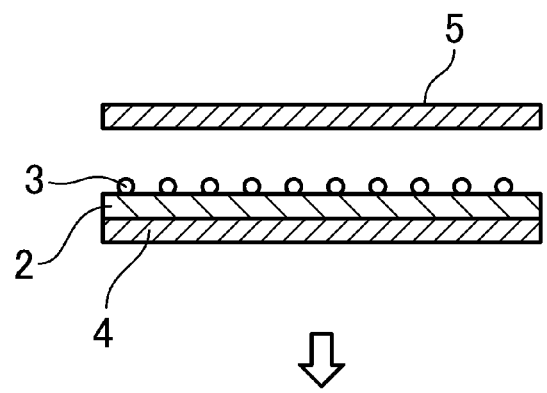
Figure 3B:

The second base film 5 constituting the anisotropic conductive film 1 is laminated on the insulating adhesive film 8 to which the electrically conductive particles 3 are transferred (FIG. 3(B)). The second base film 5 pushes the electrically conductive particles 3 that are transferred and attached to the insulating adhesive film 8 into the binder resin 2 so as to achieve positioning of the electrically conductive particles 3. The electrically conductive particles 3 are held in the binder resin 2 coated on the first base film 4 as the release treated surface of the second base film 5 is bonded to the surface onto which the electrically conductive particles 3 are transferred and attached of the insulating adhesive film 8. By virtue of this, the anisotropic conductive film 1 is formed in which the binder resin 2 containing the electrically conductive particles 3 is supported by the first and second base films 4 and 5 of an upper and lower pair.

Figure 3C:
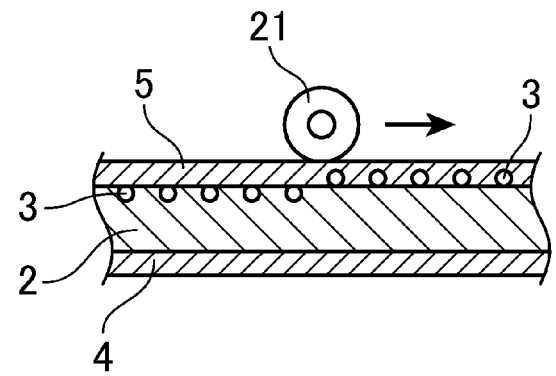

As illustrated in FIG. 3(C), the electrically conductive particles 3 are pushed into the binder resin 2 coated on the first base film 4 as the anisotropic conductive film 1 is appropriately pressed by a laminating roll 21. Subsequently, the surface on which the electrically conductive particles 3 are pushed of the binder resin 2 is cured by being irradiated with ultraviolet rays from the second base film 5 side, and the like, and thus the anisotropic conductive film 1 is fixed in the pattern formed by transfer and attachment of the electrically conductive particles 3.

[Content]

In the anisotropic conductive film 1 that is manufactured through the manufacturing process described above, the solvent 13 in which the binder resin 2 has a low solubility is contained in a constant proportion (less than 0.1%) since the vaporized solvent 13 is attached to the periphery of the electrically conductive particles 3 which are arranged in the binder resin 2.

In addition, micro bubbles which are believed to be caused by the manufacturing method according to the invention are detected as well. The bubbles are detected in the periphery of the electrically conductive particles 3 (the range within two times the average particle size of the electrically conductive particles 3), and the size thereof is equal to or smaller than the size of the opening 12, namely, approximately equal to or smaller than the electrically conductive particle 3. The bubbles are present on the surface of the adhesive layer 7 at a proportion of about 30% or less.

In addition, the bubbles are also present as ultramicro bubbles in some cases, and they may appear as a difference in local optical properties in such a case. It can be presumed that the bubbles are caused by the manufacturing method since the bubbles are present in the periphery of the electrically conductive particles 3 (the range within two times the particle size) in this case as well.

In addition, the presence of bubbles is not a cause of particularly significant deterioration in the reliability test, and thus these bubbles are not necessarily the volatilized solvent but also include the air involved at the time of lamination.

[Manufacturing Process of Connector]

The anisotropic conductive film 1 can be suitably used in a connector in which an IC or a flexible substrate is COG, FOB, or FOF connected and any devices such as television, or PC, mobile phones, game machines, audio devices, and tablet terminators, or vehicle-mounted monitors.

Figure 4:
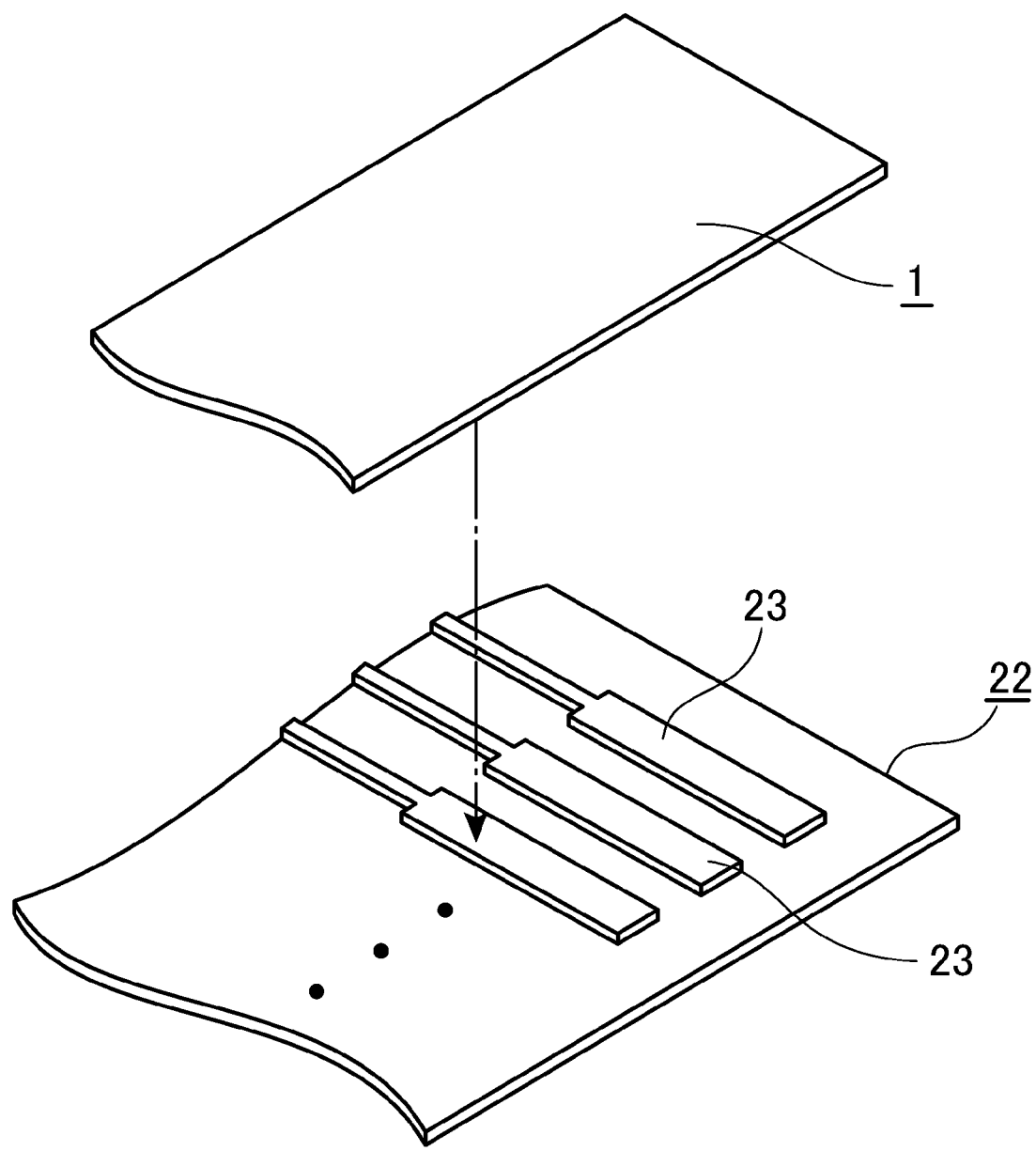
FIG. 4 is a perspective view illustrating a state in which an anisotropic conductive film is pasted to a rigid substrate having a plurality of connecting terminals arranged in parallel.
Figure 5A:
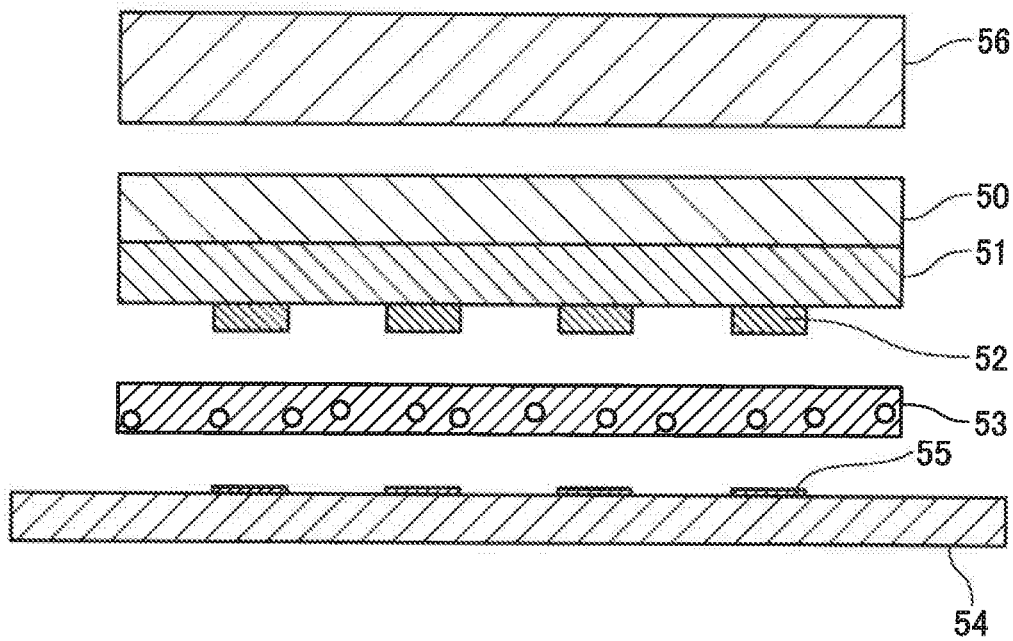
Figure 5B:
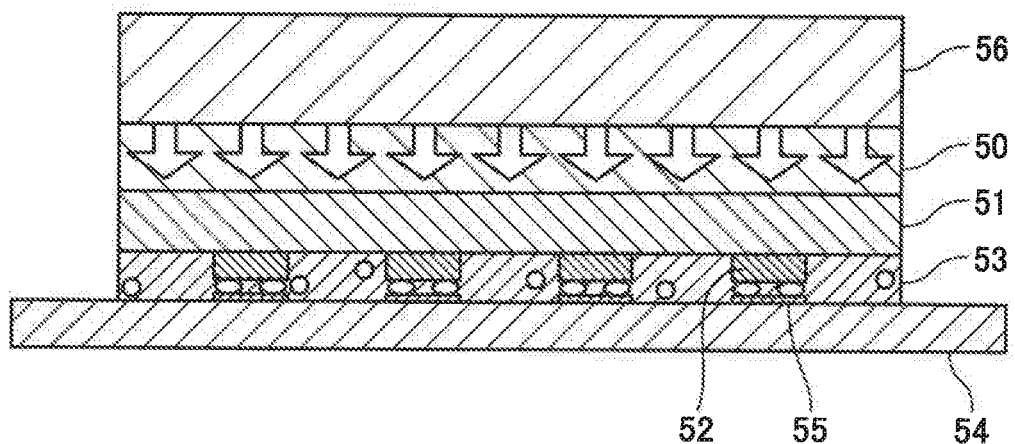

As illustrated in FIG. 4, a rigid substrate 22 that is connected to an IC or a flexible substrate via the anisotropic conductive film 1 is formed of a plurality of connecting terminals 23 arranged in parallel. These connecting terminals 23 are microminiaturized to meet the requirement of high density mounting and the interval between the connecting terminals is narrowed.

At the time of actual use, the anisotropic conductive film 1 is cut such that the size in the width direction corresponds to the size of the connecting terminal 23, and the anisotropic conductive film 1 thus cut is pasted on the plurality of connecting terminals 23 by taking the parallel direction of the connecting terminals 23 as the longitudinal direction. Subsequently, the connecting terminal of the IC or flexible substrate side is mounted on the connecting terminal 23 via the anisotropic conductive film 1, and the resultant is heated and pressurized by a pressure tool (not illustrated) from the top of it.

By virtue of this, the binder resin 2 is softened, the electrically conductive particles 3 are pressed and deformed between the connecting terminals facing each other, and the anisotropic conductive film 1 is cured in a state in which the electrically conductive particles 3 are pressed and deformed by being heated or irradiated with ultraviolet rays. By virtue of this, the anisotropic conductive film 1 electrically and mechanically connects an IC or a flexible substrate to a connecting target such as a glass substrate.

Here, in the anisotropic conductive film 1, the electrically conductive particles 3 are equally transferred and attached in a lattice shape throughout the longitudinal direction. Hence, it is possible to improve the conduction properties as the anisotropic conductive film 1 is securely captured on the microminiaturized connecting terminals 23 as well, and also it is possible to prevent a short circuit between the adjacent terminals as the electrically conductive particles 3 are not linked between the narrowed interval between connecting terminals.

EXAMPLES

Subsequently, Examples according to the invention will be described. In the present Examples, electrically conductive particles were filled using an array plate on which openings are formed in a predetermined pattern, an insulating adhesive film was pasted thereto, and the electrically conductive particles in the openings were transferred and attached to an adhesive layer, thereby obtaining an anisotropic conductive film. The anisotropic conductive film was manufactured as a plurality of samples depending on the presence or absence of a solvent, the presence or absence of heating, or a change in heating temperature. Heating the array plate was conducted using a conveying roller having a built-in heater.

In addition, the take-out rate of the electrically conductive particles was measured for each of the array plates from which the insulating adhesive film was peeled off. In addition, connector samples in which an IC was connected onto a glass substrate were manufactured using each of the anisotropic conductive films, and for each of the connector samples, a reliability test (high temperature and high humidity test: at 85° C. and 85% for 1000 hr) was performed, and the conduction resistance (Ω) was then determined.

In the insulating adhesive films according to Examples and Comparative Examples, a resin composition prepared by blending:

60 parts by mass of a phenoxy resin (YP-50, manufactured by NIPPON STEEL & SUMIKIN CHEMICAL CO., LTD.);

40 parts by mass of an epoxy resin (jER828, manufactured by Mitsubishi Chemical Corporation); and 2 parts by mass of a cationic curing agent (SI-60L, manufactured by SANSHIN CHEMICAL INDUSTRY CO., LTD.)

was used as a binder resin.

As the insulating adhesive films according to Examples and Comparative Examples, a mixed solution was prepared by adjusting the solid content of these resin compositions to be 50% with toluene, the mixed solution was coated on a PET film having a thickness of 50 μm, and the coated PET film was dried in an oven at 80° C. for 5 minutes, thereby obtaining an insulating adhesive film containing a binder resin 2 having a thickness of 20 μm.

In addition, in the anisotropic conductive films according to Examples and Comparative Examples, AUL704: (average particle size: 4 μm, manufactured by SEKISUI CHEMICAL CO., LTD.) was used as the electrically conductive particles.

A glass substrate (trade name: 1737F, manufactured by Corning Incorporated, size: 50 mm×30 mm, thickness: 0.5 mm) on which an aluminum wiring pattern corresponding to the pattern of the IC chip was formed was used as the glass substrate.

The anisotropic conductive films according to Examples and Comparative Examples were disposed on this glass substrate, the IC chip (size: 1.8 mm×20.0 mm, thickness: 0.5 mm, gold bump size: 30 μm×85 bump height: 15 μm, pitch: 50 μm) was disposed on the anisotropic conductive film, and the resultant was heated and pressurized, thereby connecting the IC chip and the aluminum wiring patterned glass substrate to each other. The condition for pressure joining was 180° C., 80 MPa, and 5 seconds.

Example 1

In Example 1, water was used as a solvent. In addition, the heating temperature of the array plate is 100° C.

Example 2

In Example 2, water was used as a solvent. In addition, the heating temperature of the array plate is 150° C.

Example 3

In Example 1, water was used as a solvent. In addition, the heating temperature of the array plate is 200° C.

Example 4

In Example 1, ethanol was used as a solvent. In addition, the heating temperature of the array plate is 150° C.

Comparative Example 1

In Comparative Example 1, a solvent was not used and also the array plate was not heated.

Comparative Example 2

In Comparative Example 2, water was used as a solvent. In addition, the heating temperature of the array plate is 50° C.

Comparative Example 3

In Comparative Example 3, water was used as a solvent. In addition, the heating temperature of the array plate is 250° C.

TABLE 1

| | Example 1 | Example 2 | Example 3 | Example 4 | Comparative Example 1 | Comparative Example 2 | Comparative Example 3 |
|---|---|---|---|---|---|---|---|
| Solvent | Water | Water | Water | Ethanol | Absence | Water | Water |
| Heating temperature | 100° C. | 150° C. | 200° C. | 150° C. | Absence | 50° C. | 250° C. |
| Take-out rate of particles | 95% | 99% or more | 90% | 95% | 80% | 83% | — |

TABLE 1-continued

| | Example 1 | Example 2 | Example 3 | Example 4 | Comparative Example 1 | Comparative Example 2 | Comparative Example 3 |
|---|---|---|---|---|---|---|---|
| Conduction resistance (Ω) | 8 | 7 | 9 | 8 | 50 | 40 | — |

As presented in Table 1, in any of Examples 1 to 3, it was possible to take out the electrically conductive particles from the openings of the array plate at a proportion of 90% or more, and also the conduction resistance between the IC chip and the connecting terminal formed on the glass substrate after the reliability test was as low as 9Ω or less.

On the other hand, in Comparative Example 1, the take-out rate of particles was as low as 80% and the conduction resistance after the reliability test was also as high as 50Ω. In addition, in Comparative Example 2 as well, the take-out rate of particles was as low as 83% and the conduction resistance after the reliability test was also still as high as 40Ω. Furthermore, in Comparative Example 3, it was not possible to maintain the film shape as the adhesive layer of the insulating adhesive film dissolved, and thus it was not possible to conduct the measurement of the take-out rate of particles and the measurement of the conduction resistance after the reliability test.

This is because, in Examples 1 to 4, the solvent filled in the openings is vaporized as the array plate is heated at the time of peeling off the insulating adhesive film from the array plate, and thus it was possible to smoothly peel off the adhesive layer from the array plate as well as to transfer and attach the electrically conductive particles to the binder resin by utilizing the volume expansion of the solvent. In addition, in Examples 1 to 4, it is possible to transfer and attach the electrically conductive particles from the openings to the binder resin at a proportion of 99% or more and the electrically conductive particles are equally dispersed and disposed in a predetermined pattern, thus a great number of the electrically conductive particles are captured even between the microminiaturized wiring pattern and the bumps, and the conduction resistance (Ω) is low even after the reliability test has been performed.

On the other hand, in Comparative Example 1, a solvent was not filled in the openings of the array plate, thus the anchoring effect that the binder resin of the insulating adhesive film entered the openings was generated, it was not possible to cleanly peel off the adhesive layer, and also 20% of the electrically conductive particles remained in the openings. For this reason, in the anisotropic conductive film according to Comparative Example 1, a region in which the electrically conductive particles were lacking in the binder resin was generated, and the conduction resistance between the wiring pattern and the bumps deteriorated in the deficient region.

In addition, in Comparative Example 2, the heating temperature of the array plate was much lower than the boiling point of water of the solvent, and thus the effect due to volume expansion was insufficient. Hence, the anchoring effect due to the binder resin was exerted in Comparative Example 2 as well, and 17% of the electrically conductive particles remained in the openings. For this reason, in the anisotropic conductive film according to Comparative Example 2, a region in which the electrically conductive particles were lacking in the binder resin was generated, and the conduction resistance between the wiring pattern and the bumps deteriorated in the deficient region.

From the above, it can be seen that it is preferable to set the heating temperature of the array plate to a temperature higher than the boiling point of the solvent in order to securely achieve the effect due to the volume expansion in a short heating time.

In Comparative Example 3, the heating temperature of the array plate was 250° C. to be significantly high, thus the binder resin of the insulating adhesive film dissolved, and it was not possible to maintain the film shape. From the above, it can be seen that it is preferable to set the heating temperature of the array plate to a temperature lower than the temperature at which the binder resin has the minimum melt viscosity.

REFERENCE SIGNS LIST

1 Anisotropic conductive film, 2 Binder resin, 3 Electrically conductive particles, 4 First base film, 5 Second base film, 6 Take-up reel, 10 Array plate, 11 Substrate, 12 Opening, 13 Solvent, 15 Squeegee, 16 Heater, 17 Conveying roller, 21 Laminating roll, 22 Rigid substrate, 23 Connecting terminal

The invention claimed is:

1. An electrically conductive adhesive film comprising:
a base film;
a binder resin laminated on the base film; and
electrically conductive particles regularly dispersed and disposed on the binder resin in a predetermined array pattern,
wherein bubbles equal to or smaller than a particle size of the electrically conductive particles are present on or located at a distance from the periphery of the electrically conductive particles independently from the conductive particles at a time when the binder resin is laminated on the base film,
the bubbles are volatilized solvent or air introduced at the time when the binder resin is laminated on the base film, and
the binder resin is a thermosetting resin.

2. The conductive adhesive film according to claim 1, wherein the bubbles are located at a distance from the periphery that is in a range within two times an average particle size of the conductive particles.

3. The conductive adhesive film according to claim 1, wherein the predetermined array pattern is made up by a plurality of sites, each site being configured to be occupied by one conductive particle, and 90% or more of the sites are occupied by the conductive particles.

4. The conductive adhesive film according to claim 3, wherein the conductive particles are present at least in an area used for connecting electronic components.

5. The conductive adhesive film according to claim 1, wherein the conductive particles are evenly arranged.

6. The conductive adhesive film according to claim 1, wherein the time when the binder resin is laminated on the base film is before any heat treatment is applied to the binder resin.

7. The conductive adhesive film according to claim 1, wherein the bubbles are present on a surface of the binder resin.

8. A method for manufacturing a connector comprising connecting a plurality of terminals arranged in parallel to one another by an anisotropic conductive film having electrically conductive particles arranged therein, wherein the anisotropic conductive film is the conductive adhesive film according to claim 1.

9. A method for manufacturing the electrically conductive adhesive film of claim 1, the method comprising:
- a step of filling a solvent and electrically conductive particles in a plurality of openings formed on a surface of a substrate in a predetermined pattern corresponding to an array pattern of the electrically conductive particles;
- a step of pasting a surface on which a binder resin layer is formed of an adhesive film having the binder resin layer formed on a base film on a surface on which the openings are formed of the substrate; and
- a step of peeling off the adhesive film from the surface of the substrate and transferring and attaching the electrically conductive particles filled in the openings to the binder resin layer while heating the substrate, wherein a binder resin of the binder resin layer is a thermosetting resin.

10. The method of claim 9, wherein the solvent is liquid or solid, and
the solvent is vaporized as the substrate is heated.

11. The method of claim 9, wherein a heating temperature of the substrate is equal to or higher than a boiling temperature of the solvent that is liquid.

12. The method of claim 9, wherein a heating temperature of the substrate is lower than a temperature at which the binder resin layer has the minimum melt viscosity.

13. The method of claim 9, wherein the binder resin layer has a solubility of 5% or less in the solvent.

14. The method of claim 9, wherein a second base film is laminated on the binder resin layer after the electrically conductive particles are transferred and attached to the binder resin layer.

15. The method of claim 14, wherein the electrically conductive particles are embedded into the inside of the binder resin layer as a pressure roll rolls on the second base film.

16. The method of claim 9, wherein bubbles are present on a surface of the binder resin layer.

* * * * *